(12) United States Patent
Chandra et al.

(10) Patent No.: US 10,236,888 B2
(45) Date of Patent: Mar. 19, 2019

(54) CORRELATED ELECTRON SWITCH DEVICE

(71) Applicant: ARM Ltd., Cambridge (GB)

(72) Inventors: Vikas Chandra, Fremont, CA (US); Robert Campbell Aitken, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/083,561

(22) Filed: Mar. 29, 2016

(65) Prior Publication Data

US 2017/0288675 A1 Oct. 5, 2017

(51) Int. Cl.
*H03K 19/177* (2006.01)
*G11C 13/00* (2006.01)

(52) U.S. Cl.
CPC ..... *H03K 19/1776* (2013.01); *G11C 13/0007* (2013.01); *H03K 19/1778* (2013.01); *H03K 19/17704* (2013.01); *H03K 19/17744* (2013.01); *G11C 13/0069* (2013.01)

(58) Field of Classification Search
CPC ......... H03K 19/1776; H03K 19/07744; H03K 19/17736
USPC .............................................. 326/38–41, 47
See application file for complete search history.

(56) References Cited

U.S. PATENT DOCUMENTS

| | | | |
|---|---|---|---|
| 6,362,650 B1 * | 3/2002 | New ................... | G06F 15/7867 326/41 |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,514,814 B1 | 12/2016 | Sandhu et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 2003/0122578 A1 * | 7/2003 | Masui ................... | G06F 21/76 326/39 |
| 2005/0045919 A1 | 3/2005 | Kaeriyama et al. | |
| 2008/0106925 A1 * | 5/2008 | Paz de Araujo ........ | H01L 45/04 365/148 |
| 2008/0106926 A1 | 5/2008 | Brubaker | |
| 2008/0107801 A1 | 5/2008 | Celinska et al. | |
| 2009/0033361 A1 * | 2/2009 | Thummalapally .... | H01L 27/098 326/44 |
| 2011/0175645 A1 * | 7/2011 | Hayasaka ........ | H03K 19/17772 326/41 |
| 2013/0200323 A1 | 8/2013 | Pham et al. | |
| 2013/0214232 A1 | 8/2013 | Tendulkar et al. | |

(Continued)

OTHER PUBLICATIONS

PCT/GB2017/050505: International Search Report and Written Opinion, dated May 16, 2017, 15 pages.

(Continued)

*Primary Examiner* — Dylan C White
(74) *Attorney, Agent, or Firm* — Berkeley Law & Technology Group, LLP

(57) ABSTRACT

Disclosed are a circuit and method for implementing a switching function. In an embodiment, the circuit includes a first logic circuit, a second logic circuit, and a Correlated electron switch (CES) element. The CES element is configurable to have a non-volatile state to enable or disable an electrical connection between the first logic circuit and the second logic circuit.

13 Claims, 5 Drawing Sheets

(56) References Cited

U.S. PATENT DOCUMENTS

| | | | |
|---|---|---|---|
| 2013/0285699 A1* | 10/2013 | McWilliams | H03K 19/173 326/41 |
| 2014/0103960 A1* | 4/2014 | Yamazaki | H03K 19/0013 326/41 |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |

OTHER PUBLICATIONS

PCT/GB2017/050505: Application as filed Feb. 24, 2017, 25 pages.
International Preliminary Report on Patentability, dated Oct. 11, 2018, International Patent Application No. PCT/GB2017/050505, 11 pgs.

\* cited by examiner

CORRELATED ELECTRON SWITCH DEVICE

FIELD OF THE INVENTION

The present techniques generally relate to a switching device, and more particularly to a Field Programmable Gate Array (FPGA) device comprising a correlated electron switch.

BACKGROUND

A typical Field Programmable Gate Array (FPGA) device includes input-output circuits, logic circuits, an interconnect network and switch blocks. The interconnect lines are conductive paths that are laid across the FPGA architecture to enable coupling among the logic blocks, the input-output blocks, and between the input-output blocks and the logic blocks. The switch blocks are connecting elements that couple the interconnect lines based on a coupling requirement among the logic blocks, the input-output blocks or between the logic blocks and the input-output blocks. Conventionally, the switch blocks are implemented using switches. Each switch of a switch block may be coupled to an external memory that is used to store a desired configuration for the switch. Further, the switch is programmed using the desired configuration to achieve a desired state, such as 'On' or 'Off'.

SUMMARY

According to a first aspect of the present technique, a circuit is provided. The circuit comprises a first logic circuit, a second logic circuit, and a Correlated Electron Switch (CES). The CES element may be configurable to enable or disable a connection between the first logic circuit and the second logic circuit.

According to second aspect of the present technique, a Field Programmable Gate Array (FPGA) device is provided. The FPGA comprises a plurality of logic circuits; and a plurality of Correlated Electron Switches (CES). Each CES may be configurable to enable or disable connections between two or more logic circuits of the plurality of logic circuits.

According to third aspect of the present technique, there is provided a method comprising: coupling a first logic circuit to a second logic circuit by programming a Correlated Electron Switch (CES) into a first state and; decoupling (uncoupling) the first logic circuit from the second logic circuit by programming the CES into a second state.

The following features apply equally to each of the above aspects.

In embodiments, the first logic circuit and the second logic circuit may be one of a programmable logic element and an Input-Output (IO) block.

In embodiments, a first channel may be coupled to the first logic circuit; and a second channel may be coupled to the second logic circuit, wherein the CES enables or disables the connection between the first channel and the second channel.

In embodiments, a programming circuit may be coupled to the CES and configured to program the CES into: a first impedance state to enable the connection; and a second impedance state to disable the connection.

The first impedance state may be a low impedance state and the second impedance state may be a high impedance state.

The CES may maintain the enabled connection until the CES is reprogrammed by the programming circuit. The CES is a type of non volatile memory that is capable of maintaining a state even when a voltage supply (power supply) is disconnected from the CES.

The circuit may be a circuit of a Field Programmable Gate Array (FPGA).

In an FPGA circuit, the plurality of logic circuits may comprise one or more programmable logic elements and/or one or more Input-Output (IO) blocks.

The FPGA circuit may comprise an interconnect network comprising a plurality of channels, wherein each channel of the plurality of channels is connected to one logic circuit of the plurality of logic circuits, and wherein each CES enables or disables a connection between the plurality of channels.

The FPGA circuit may comprise at least one programming circuit coupled to the plurality of CES and configured to program each CES element to: a first impedance state to enable the connection; and a second impedance state to disable the connection. The first impedance state may be a low impedance state and the second impedance state may be a high impedance state.

In an FPGA circuit, each of the CES elements may maintain the enabled connection until the CES is reprogrammed by the programming circuit.

In embodiments, programming the CES into a first state comprises programming the CES element into a low impedance state, and programming the CES into a second state comprises programming the CES element into a high impedance state.

In a related aspect of the present technique, there is provided a non-transitory data carrier carrying code which, when implemented on a processor, causes the processor to carry out the methods described herein.

As will be appreciated by one skilled in the art, the present techniques may be embodied as a system, method or computer program product. Accordingly, present techniques may take the form of an entirely hardware embodiment, an entirely software embodiment, or an embodiment combining software and hardware aspects.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

BRIEF DESCRIPTION OF THE DRAWINGS

The techniques are diagrammatically illustrated, by way of example, in the accompanying drawings, in which.

DETAILED DESCRIPTION

Figure 1:
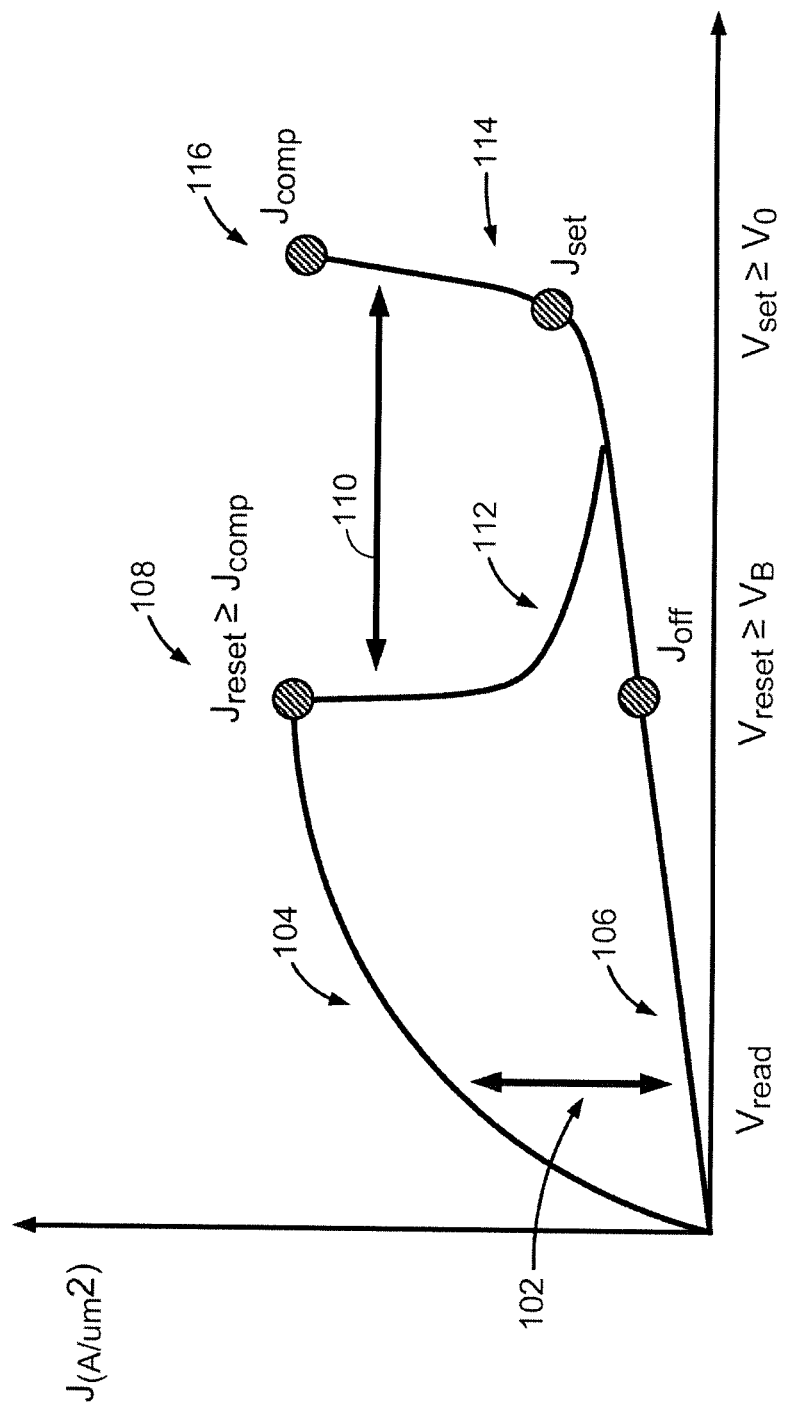
FIG. 1 shows a plot of current density versus voltage for a Correlated Electron Switch (CES) element.

Broadly speaking, embodiments of the present techniques provide circuitry to route a signal using one or more switches to route the signal along a particular path or routing track. The circuitry may use a memory to, for example, store configurations of the circuitry, and in particular, to store signal routing configurations. In particular embodiments, the memory or memory element may be used to control the switches to change how a signal is routed. The memory element may be a non volatile memory (NVM) element, such as a Correlated Electron Switch (CES) element which comprises a correlated electron material (CEM). The CES may be used both as non volatile storage as well as a circuit element that can enable connectivity in a circuit. As explained in more detail below, the CES element comprises a material that may transition between predetermined detectable memory states based at least in part on a transition of (at least a portion of) the material between a conductive state and an insulative state. The CES element is programmable such that it may store a configuration in a non-volatile manner, and use its impedance state to enable connectivity.

The term "correlated electron switch" is used interchangeably herein with "CES", "CES element", "CES device", "correlated electron random access memory", "CeRAM", and "CeRAM device".

Non-volatile memories are a class of memory in which the memory cell or element does not lose its state after power supplied to the device is removed. In flash memory devices, an ability to keep random access (erase/write single bits) was sacrificed for speed and higher bit density. Flash remains a non-volatile memory of choice. Nevertheless, it is generally recognized that flash memory technology may not scale easily below 40 nanometers (nm); thus, new non-volatile memory devices capable of being scaled to smaller sizes are actively being sought.

A CES is a particular type of switch formed (wholly or in part) from a CEM. Generally speaking, a CES may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices, as discussed above). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows a plot of current density versus voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$ required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1 may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 2:
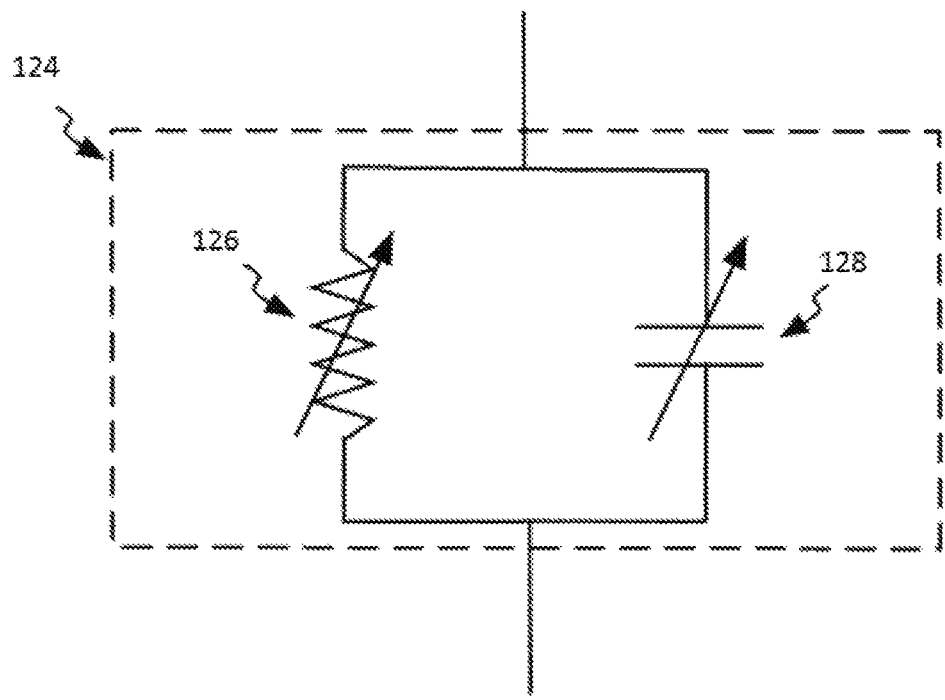
FIG. 2 is a schematic diagram of an equivalent circuit to a CES device.

FIG. 2 depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 2 as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 3:
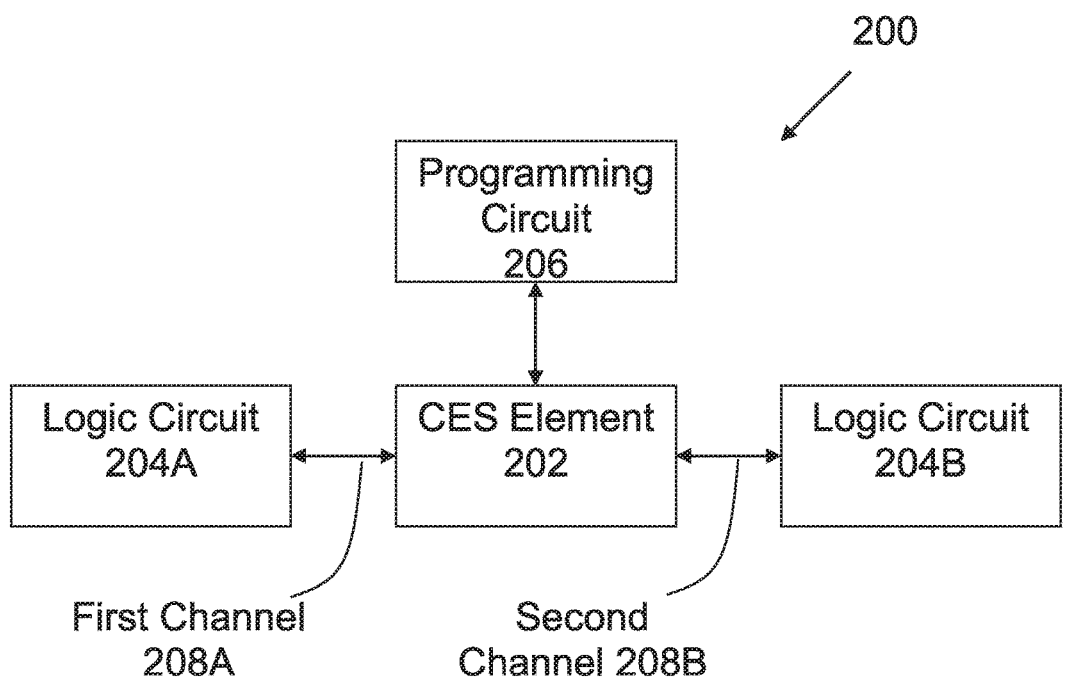
FIG. 3 shows a schematic diagram of an exemplary circuit including a Correlated Electron Switch (CES) element, according to one embodiment.

FIG. 3 illustrates a schematic view of a circuit 200, according to one embodiment of the present techniques. The circuit 200 may include a logic circuit 204A and a logic circuit 204B. The circuit may further include a Correlated Electron Switch (CES) element. The circuit 200 may use the CES element 202 as a switching element. The CES element 202 may be programmed into a first impedance state or a second impedance state. The first impedance state may be a low impedance state. The second impedance state may be a high impedance state. In the low impedance state, the CES element 202 provides a low impedance to the current passing through, such that the CES element behaves like a closed switch. The low impedance may be a low resistance, a low capacitance, or a combination thereof. In the high impedance state, the CES element 202 offers a high impedance, for example, a high resistance, a high capacitance, or a combination thereof, to passage of the current, thereby, exhibiting a characteristic of an open switch. Thus, the CES element 202 may be programmed to a desired impedance state to enable or disable a connection between the logic circuits 204A and 204B.

The circuit 200 may also include a first channel 208A and a second channel 208B. The first channel 208A may be connected to the logic circuit 204A. The second channel 208B may be connected to the logic circuit 204B. The first channel 208A and the second channel 208B are connected to the CES element 202. The circuit 200 utilizes the CES element 202 to enable or disable a connection between the logic circuit 204A and the logic circuit 204B through the channels 208A-B. The circuit 200 includes a programming circuit 206 to program the CES element 202 into the low impedance state or the high impedance state. The CES 202 may be programmed into a particular impedance state using a variety of programming (write) circuits. Examples of such programming (write) circuits may be found in the Applicant's pending U.S. patent application Ser. No. 14/826,110 which is incorporated herein by reference in its entirety.

The CES element 202 may be initially programmed at a high impedance state, according to one example implementation. At the high impedance state, the CES element 202 exhibits a characteristic of an open switch, disabling a connection between the first channel 208A and the second channel 208B. The programming circuit 206 programs the CES element 202 to the low impedance state for enabling the connection between the first channel 208A and the second channel 208B. The programming circuit 206 programs the CES element 202 to the low impedance state by providing a first signal as described in conjunction with FIG. 1.

The CES element 202, in the low impedance state exhibits a characteristic of the closed switch, connecting the first channel 208A and the second channel 208B. The low impedance state of the CES element 202 enables the connection between the logic circuit 204A and the logic circuit 204B.

The programming circuit 206 may program the CES element 202 in the low impedance state to switch to the high impedance state. The programming circuit 206 may program the CES element 202 into the high impedance state by providing a second signal in conjunction with FIG. 1. In the high impedance state, the CES element 202 exhibits a characteristic of the open switch, disabling the connection between the first channel 208A and the second channel 208B. The CES element 202 persists an impedance state until the CES element 202 is programmed or reprogrammed.

As mentioned above, the programming circuit 206 may be implemented using various electronic components. Unlike conventional electronic switches that require buffers to store configurations, correlated electron switches do not require any additional memory devices since the correlated electron switches are non-volatile, and the impedance state is maintained even when a voltage (power) supply is disconnected. The correlated electron switches may be directly programmed, and the programmed state is maintained until the CES is reprogrammed.

Figure 4:
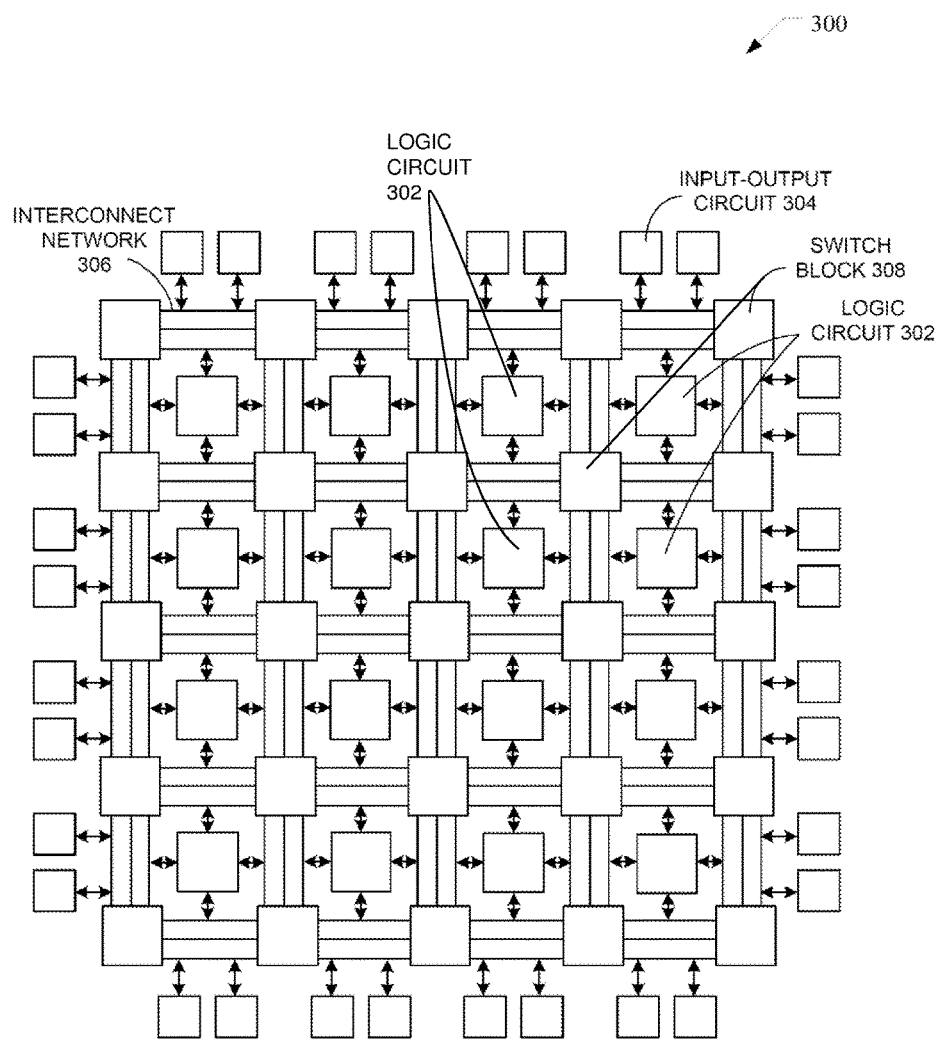
FIG. 4 shows an exemplary Field Programmable Gate Array (FPGA) architecture, according to one embodiment.

In an embodiment, the correlated electron switches may be used in a Field Programmable Gate Array (FPGA) circuit as illustrated in FIG. 4.

The FPGA 300 may include an array of logic circuits 302, input-output (IO) circuits 304, and routing resources. The logic circuits 302 may include programmable elements that can be programmed to implement a particular circuit function. The IO circuits 304 may be interface circuits between the FPGA 300 and external devices. The routing resources may include an interconnect network 306 and switch blocks 308.

The interconnect network 306 may include a plurality of vertical channels and horizontal channels. The switch blocks 308 may be situated strategically at possible junctions of the plurality of vertical channels and horizontal channels. Each switch block 308 includes one or more correlated electron switches to couple the one or more logical circuits 302 through one or more plurality of the vertical channels and horizontal channels. An example of the correlated electron switch implementation in the switch blocks 308 of the FPGA 300 is described below in FIG. 5.

Figure 5:
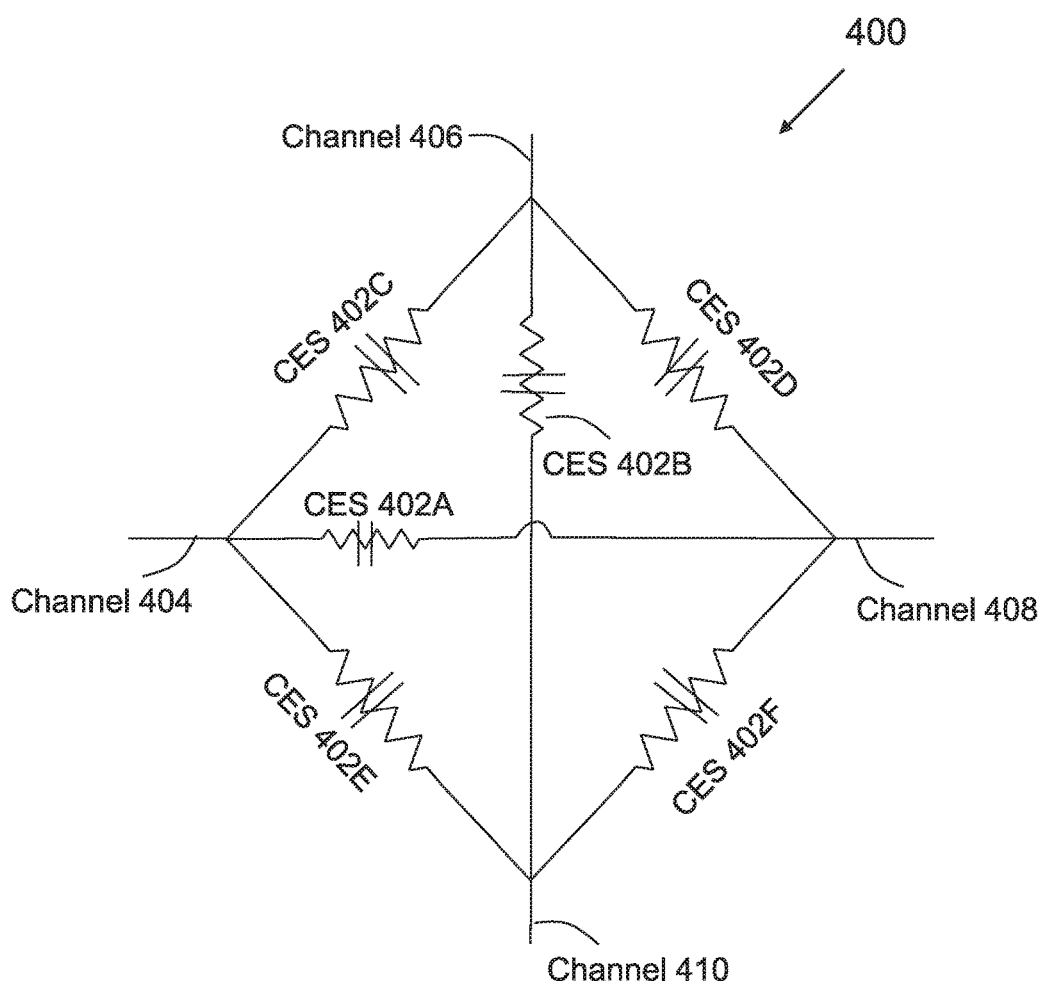
FIG. 5 illustrates an exemplary CES-based FPGA switch, according to one embodiment.

FIG. 5 illustrates an exemplary CES-based FPGA switch block 400, according to one embodiment. FIG. 5 shows a six switch configuration of the FPGA switch block 400, the switch block 400 comprising CES elements 402A, 402B, 402C, 402D, 402E and 402F, and four channels 404, 406, 408 and 410. The FPGA switch block 400 connects the four channels 404-410. (As the impedance state of each CES element 402A-F may be based on resistance, capacitance, or a combination thereof, the circuit symbol to represent a CES element is a capacitor symbol overlaid on a resistor symbol).

Each of the switches in the six switch configuration may be a CES element. Each of the CES elements 402A-F may be programmed independently to a required impedance state. At least one programming circuit (not shown) may be used program each of the CES elements 402A-F. Each channel of the channels 404-410 is coupled to other channels via corresponding CES elements 402A-F. Based on connection requirements between the logic circuits, one or more channels 404-410 may be selected and the corresponding CES elements 402A-F may be used to enable the connection between the channels. For example, if a horizontal channel 404 is to be connected to a vertical channel 410, the CES element 402E is switched to the low impedance state.

Although, FIG. 5 illustrates implementation of the correlated electron switches in the FPGA based switch block 400, the correlated electron switches may also be implemented in the interconnect network 306. The CES elements may be also used in the IO circuits 304. For example, the CES elements may be used to connect circuit components within the IO circuits 304. Furthermore, a CES may be used to connect programmable elements within the logic circuits. Also, a CES may be used in connecting the channels of the interconnect network 306 with the logic circuits 302, the channels with the IO circuits 304, and the like. Unlike conventional FPGAs or any integrated circuits which required an external memory source for storing a desired configuration, the CES does not require any additional memory. Consequently, physical space may be saved in the FPGA or the integrated circuits, i.e. the physical size of the FPGA or integrated circuits may be reduced compared to conventional FPGA or integrated circuits. The saved space may be used to incorporate additional circuits.

Embodiments of the present techniques also provide a non-transitory data carrier carrying code which, when implemented on a processor, causes the processor to carry out the methods described herein. The processor may be provided within or coupled to the programming circuit used to program the or each CES element into a particular impedance state.

The techniques further provide processor control code to implement the above-described methods, for example on a general purpose computer system or on a digital signal processor (DSP). The techniques also provide a carrier carrying processor control code to, when running, implement any of the above methods, in particular on a non-transitory data carrier—such as a disk, microprocessor, CD- or DVD-ROM, programmed memory such as read-only memory (firmware), or on a data carrier such as an optical or electrical signal carrier. The code may be provided on a carrier such as a disk, a microprocessor, CD- or DVD-ROM, programmed memory such as non-volatile memory (e.g. Flash) or read-only memory (firmware). Code (and/or data) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, said functional data comprising functional computer data structures to, when loaded into a computer system or network and operated upon thereby, enable said computer system to perform all the steps of the above-described method.

Although illustrative embodiments of the disclosure have been described in detail herein with reference to the accompanying drawings, it is to be understood that the disclosure is not limited to those precise embodiments, and that various changes and modifications can be effected therein by one skilled in the art without departing from the scope and spirit of the disclosure as defined by the appended claims.

The invention claimed is:

1. A circuit comprising:
   a plurality of logic circuits coupled to a plurality of channels; and
   a switch block comprising a plurality of Correlated Electron Switches (CESs), each of the CESs being configurable to a first non-volatile state to enable or disable a connection between a selected pair of the plurality of channels, wherein the switch block is capable of establishing a connection between any pair of the plurality of channels by placing a single CES of the plurality of the CESs in a conductive or low impedance state while maintaining remaining CESs of the plurality of CESs in an insulative or high impedance state, wherein the single CES comprises a correlated electron material and is enabled to be placed in the conductive or low impedance state by injection of electrons in the correlated electron material to achieve a sufficient concentration of electrons in the correlated electron material.

2. The circuit of claim 1, wherein a first logic circuit of the plurality of logic circuits comprises a programmable logic element, and wherein the circuit further comprises an Input-Output (IO) block and a CES configurable to a non-volatile state to enable or disable a connection between the first logic circuit and the IO block.

3. The circuit of claim 1, wherein:
   a first channel of the plurality of channels is coupled to a first logic circuit of the plurality of logic circuits; and
   a second channel of the plurality of channels is coupled to a second logic circuit of the plurality of logic circuits, wherein at least one CES of the plurality of CESs is configurable to enable or disable a connection between the first channel and the second channel.

4. The circuit of claim 1, further comprising a programming circuit coupled to a CES of the plurality of CESs and configured to program the CES to:
   the conductive or low impedance state to enable a connection between first and second logic circuits of the plurality of logic circuits; and
   the insulative or high impedance state to disable the connection between the first and second logic circuits.

5. The circuit of claim 1, wherein the single CES is configurable to maintain the connection between the pair of channels until the single CES is reprogrammed.

6. The circuit of claim 1, wherein the circuit comprises a Field Programmable Gate Array (FPGA) device.

7. A Field Programmable Gate Array (FPGA) device comprising:
   a plurality of logic circuits coupled to a plurality of channels; and
   a plurality of Correlated Electron Switches (CESs), each of the CESs being configurable to a non-volatile state to enable or disable a connection between a selected pair of the plurality of channels, wherein the FPGA device is capable of establishing a connection between any pair of the plurality of channels by placing a single CES of the plurality of the CESs in a conductive or low impedance state while maintaining remaining CESs of the plurality of CESs in an insulative or high impedance state, wherein the single CES comprises a correlated electron material and is enabled to be placed in the conductive or low impedance state by injection of electrons in the correlated electron material to achieve a sufficient concentration of electrons in the correlated electron material.

8. The FPGA device of claim 7, wherein the plurality of logic circuits comprises one or more programmable logic elements, and wherein the FPGA device further comprises one or more Input-Output (IO) blocks, and wherein at least one of the CESs is configurable to a non-volatile state to enable or disable one or more connections between the one or more programmable logic elements and the one or more IO blocks.

9. The FPGA device of claim 7:
wherein each channel of the plurality of channels is connected to one logic circuit of the plurality of logic circuits.

10. The FPGA device of claim 7, further comprising at least one programming circuit coupled to the plurality of CESs and configured to program the at least one of the CESs to:
the conductive or low impedance state to enable the connection; and
the insulative or high impedance state to disable the connection.

11. The FPGA device of claim 7, wherein at least one CES of the plurality of CES is configurable to the conductive or low impedance state to maintain a connection until the at least one of the plurality of CESs is reprogrammed.

12. A method, at a field programmable gate array (FPGA), comprising:
selecting a pair of channels from a plurality of channels;
coupling the selected pair of channels by programming a Correlated Electron Switch (CES) of a plurality of CESs to a low impedance or conductive state to enable a connection between the selected pair of channels while maintaining remaining CESs of the plurality of CESs in an insulative or high impedance state, wherein the plurality of CESs are configurable to establish a connection between any pair of the plurality of channels by placing a single CES of the plurality of CESs in the conductive or low impedance state while maintaining remaining CESs of the plurality of CESs in an insulative or high impedance state, wherein the single CES comprises a correlated electron material and is programmable to the conductive or low impedance state by injection of electrons in the correlated electron material to achieve a sufficient concentration of electrons in the correlated electron material; and
decoupling the selected pair of channels by programming the CES to the insulative or high impedance state.

13. A non-transitory data carrier carrying code which, when implemented on a processor, causes the processor to:
select a pair of channels from a plurality of channels;
program a Correlated Electron Switch (CES) of a plurality of CESs to a low impedance or conductive state to establish a connection between the selected pair of the plurality of channels, wherein the plurality of CESs are configurable to establish a connection between any pair of the plurality of channels by having a single CES of the plurality of CESs in the conductive or low impedance state while having remaining CESs of the plurality of CESs in an insulative or high impedance state, wherein the single CES comprises a correlated electron material is programmable to the conductive or low impedance state by injection of electrons in the correlated electron material to achieve a sufficient concentration of electrons in the correlated electron material; and
program other CESs of the plurality of CES to a high impedance or insulative state to disable connections between pairs of the logic circuits other than the selected logic circuit.

\* \* \* \* \*